US011469329B2

(12) United States Patent
Mo et al.

(10) Patent No.: US 11,469,329 B2
(45) Date of Patent: Oct. 11, 2022

(54) ACTIVE SWITCH, MANUFACTURING METHOD THEREOF AND DISPLAY DEVICE

(71) Applicant: HKC CORPORATION LIMITED, Shenzhen (CN)

(72) Inventors: Qionghua Mo, Shenzhen (CN); En-Tsung Cho, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/284,468

(22) PCT Filed: Dec. 10, 2018

(86) PCT No.: PCT/CN2018/120042
§ 371 (c)(1),
(2) Date: Apr. 11, 2021

(87) PCT Pub. No.: WO2020/113595
PCT Pub. Date: Jun. 11, 2020

(65) Prior Publication Data
US 2021/0391474 A1 Dec. 16, 2021

(30) Foreign Application Priority Data

Dec. 3, 2018 (CN) .......................... 201811466312.6

(51) Int. Cl.
*H01L 29/786* (2006.01)
*H01L 29/423* (2006.01)
*H01L 29/66* (2006.01)

(52) U.S. Cl.
CPC .. *H01L 29/78663* (2013.01); *H01L 29/42384* (2013.01); *H01L 29/6675* (2013.01); *H01L 29/78609* (2013.01); *H01L 29/78618* (2013.01)

(58) Field of Classification Search
CPC ......... H01L 29/78663; H01L 29/42384; H01L 29/6675; H01L 29/78609; H01L 29/78618;
(Continued)

(56) References Cited

U.S. PATENT DOCUMENTS

2011/0269274 A1* 11/2011 Furuta ............... H01L 29/78618
257/E21.414
2012/0037913 A1  2/2012 Seo et al.
(Continued)

FOREIGN PATENT DOCUMENTS

CN         102598281 A  *  7/2012  ....... H01L 29/66765
CN         102768989 A     11/2012
(Continued)

OTHER PUBLICATIONS

Zhimin Zhao, the ISA written comments, dated Aug. 2019, CN.
Zhimin Zhao, the International Search Report, dated Aug. 2019, CN.

*Primary Examiner* — Edward Chin (57) ABSTRACT

The present application relates to an active switch, a manufacturing method thereof and a display device. The manufacturing method of the active switch includes: sequentially forming a gate electrode, a gate insulating layer, an active layer, a semiconductor composite layer and a source electrode and a drain electrode on a substrate. The semiconductor composite layer includes a first N-type heavily doped amorphous silicon layer, a first N-type lightly doped amorphous silicon layer, a second N-type heavily doped amorphous silicon layer and a second N-type lightly doped amorphous silicon layer which are sequentially stacked, where the ion doping concentration of the first N-type heavily doped amorphous silicon layer is lower than that of the second N-type heavily doped amorphous silicon layer, and the ion doping concentration of the first N-type lightly
(Continued)

doped amorphous silicon layer is higher than that of the second N-type lightly doped amorphous silicon layer.

19 Claims, 4 Drawing Sheets

(58) Field of Classification Search
CPC ............. H01L 29/0847; H01L 29/1604; H01L 29/66765; H01L 29/78669
See application file for complete search history.

(56) References Cited

U.S. PATENT DOCUMENTS

| | | | |
|---|---|---|---|
| 2013/0026574 A1 | 1/2013 | Nakanishi et al. | |
| 2017/0162707 A1* | 6/2017 | Lv | H01L 29/78621 |
| 2021/0296505 A1* | 9/2021 | Ohta | H01L 29/6675 |
| 2021/0327913 A1* | 10/2021 | Cho | H01L 29/458 |

FOREIGN PATENT DOCUMENTS

| | | | |
|---|---|---|---|
| CN | 104716199 A | 6/2015 | |
| CN | 104766859 A | 7/2015 | |
| CN | 105161503 A | 12/2015 | |
| KR | 20100052174 A | 5/2010 | |

* cited by examiner

ACTIVE SWITCH, MANUFACTURING METHOD THEREOF AND DISPLAY DEVICE

CROSS REFERENCE OF RELATED APPLICATIONS

The present application claims priority to the Chinese Patent Application No. CN201811466312.6, filed with the National Intellectual Property Administration, PRC on Dec. 3, 2018 and entitled "ACTIVE SWITCH, MANUFACTURING METHOD THEREOF AND DISPLAY DEVICE", which is incorporated herein by reference in its entirety.

TECHNICAL FIELD

The present application relates to the technical field of display, particularly to an active switch, a manufacturing method thereof and a display device.

BACKGROUND

The statements herein merely provide background information related to the present application and do not necessarily constitute the conventional art.

The Gate Driver on Array (GOA) technology can realize the progressive scanning driving function of a display panel, and the gate driver circuit is integrated on the array substrate of the display panel by utilizing the GOA technology, so that the gate driver integrated circuit can be omitted, and the product cost can be reduced from two aspects of material cost and manufacturing process.

The switch element, such as a Thin Film Transistor (TFT), used for controlling the progressive scanning switch often cause various defects in the GOA circuit due to the presence of leakage current in itself. For example, in an embedded touch display, one frame time is divided into a touch stage and a display stage, and the embedded touch display is driven in a time-sharing driver mode. During the touch driving, because of the presence of TFT leakage current, a high potential of the GOA unit at a stage where the output of gate drive signals is suspended gradually reduces, and when the display stage is restarted, the output voltage of the GOA unit at that stage is lower than the voltage of a normal gate drive signal. Therefore, a dark line formed due to darker display brightness appears on the display screen, and the issue appears every time the touch display stage is switched to the display stage, and finally a user will see a plurality of dark lines on the display screen.

Compared with integrated circuit driving, the GOA driving also has certain risk in terms of quality ability and reliability mainly caused by threshold voltage shift characteristic of the hydrogen-doped amorphous silicon semiconductor and the like. How to reduce the threshold voltage shift of TFT devices and thereby improve the display effect of a display is also an urgent problem to be solved by the skilled in the art.

SUMMARY

According to various embodiment of the present application, a manufacturing method of an active switch capable of improving TFT leakage current and threshold voltage shift is provided.

In addition, an active switch and a display device are also provided.

A manufacturing method of an active switch is provided, which includes:

providing a substrate, depositing a first metal layer on the substrate, and carrying out patterning treatment on the first metal layer to form a gate electrode;

depositing a gate insulating layer on the substrate, where the gate insulating layer covers the gate electrode;

sequentially depositing an active layer and a semiconductor composite layer on the gate insulating layer, the semiconductor composite layer including a first N-type heavily doped amorphous silicon layer, a first N-type lightly doped amorphous silicon layer, a second N-type heavily doped amorphous silicon layer and a second N-type lightly doped amorphous silicon layer which are sequentially stacked, where the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer;

carrying out photoetching treatment on the active layer and the semiconductor composite layer;

depositing a second metal layer on the semiconductor composite layer, and carrying out photoetching and wet etching treatment on the second metal layer to obtain a first groove located at the middle of the second metal layer and penetrating through the second metal layer, where the second metal layer is partitioned into a source electrode and a drain electrode by the first groove;

performing dry etching treatment on the active layer and the semiconductor composite layer with the source electrode and the drain electrode as etching barrier layers to obtain a second groove corresponding to the first groove, where the second groove penetrates through the semiconductor composite layer and partially penetrates to the active layer, and the first groove and the second groove form a channel region; and placing the channel region in a preset gas atmosphere for heating treatment.

An active switch manufactured using a manufacturing method of an active switch is provided, where the method includes:

providing a substrate, depositing a first metal layer on the substrate, and carrying out patterning treatment on the first metal layer to form a gate electrode;

depositing a gate insulating layer on the substrate, where the gate insulating layer covers the gate electrode;

sequentially depositing an active layer and a semiconductor composite layer on the gate insulating layer, the semiconductor composite layer including a first N-type heavily doped amorphous silicon layer, a first N-type lightly doped amorphous silicon layer, a second N-type heavily doped amorphous silicon layer and a second N-type lightly doped amorphous silicon layer which are sequentially stacked, where the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer;

carrying out photoetching treatment on the active layer and the semiconductor composite layer;

depositing a second metal layer on the semiconductor composite layer, and carrying out photoetching and wet etching treatment on the second metal layer to obtain a first groove located at the middle of the second metal layer and penetrating through the second metal layer, where the second metal layer is partitioned into a source electrode and a drain electrode by the first groove;

performing dry etching treatment on the active layer and the semiconductor composite layer with the source electrode and the drain electrode as etching barrier layers to obtain a second groove corresponding to the first groove, where the second groove penetrates through the semiconductor composite layer and partially penetrates to the active layer, and the first groove and the second groove form a channel region; and placing the channel region in a preset gas atmosphere for heating treatment;

the active switch including:

a substrate;

a gate electrode formed on the substrate;

a gate insulating layer formed on the substrate, where the gate insulating layer covers the gate electrode;

an active layer formed on the gate insulating layer;

a semiconductor composite layer formed on the active layer; and a source electrode and a drain electrode formed on the semiconductor composite layer;

where the semiconductor composite layer includes a first N-type heavily doped amorphous silicon layer, a first N-type lightly doped amorphous silicon layer, a second N-type heavily doped amorphous silicon layer and a second N-type lightly doped amorphous silicon layer which are sequentially stacked, where the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer; a channel region is located at the middle of the semiconductor composite layer and the channel region penetrates through the semiconductor composite layer and partially penetrates to the active layer; and the source electrode and the drain electrode are respectively located at the two sides of the channel region.

A display device including an active switch is provided, where the active switch includes:

a substrate;

a gate electrode formed on the substrate;

a gate insulating layer formed on the substrate, where the gate insulating layer covers the gate electrode;

an active layer formed on the gate insulating layer;

a semiconductor composite layer formed on the active layer; and a source electrode and a drain electrode formed on the semiconductor composite layer;

where the semiconductor composite layer includes a first N-type heavily doped amorphous silicon layer, a first N-type lightly doped amorphous silicon layer, a second N-type heavily doped amorphous silicon layer and a second N-type lightly doped amorphous silicon layer which are sequentially stacked, where the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer; a channel region is located at the middle of the semiconductor composite layer and the channel region penetrates through the semiconductor composite layer and partially penetrates to the active layer; and the source electrode and the drain electrode are respectively located at the two sides of the channel region.

In the manufacturing method of the active switch described above, by arranging the semiconductor composite layer (the first N-type heavily doped amorphous silicon layer, the first N-type lightly doped amorphous silicon layer, the second N-type heavily doped amorphous silicon layer and the second N-type lightly doped amorphous silicon layer) with a plurality of concentration gradients to replace the original single-layer doped layer, energy barrier between the source and drain electrodes and the semiconductor composite layer can be increased, potential barrier of hole transmission can be improved, and the leakage current of a back channel in a switch device can be reduced; and further, by placing the channel region in a preset gas atmosphere for heating treatment, the damage of the channel region can be repaired, weak bonds in the amorphous silicon can be reduced, the illumination and illumination stability of the active switch can be enhanced and the drift of the threshold voltage is reduced, and thus the final display effect of the display device can be improved.

BRIEF DESCRIPTION OF DRAWINGS

In order to more clearly illustrate the technical solutions in the embodiments of the present application or in the exemplary technologies, the drawings required in the description of the embodiments or the exemplary technologies will be briefly described below. Obviously, the drawings in the following description are merely some embodiments of the present application, and those of ordinary skill in the art can obtain other drawings according to the drawings without any inventive labor.

DETAILED DESCRIPTION OF EMBODIMENTS

To facilitate understanding of the present application, the present application will now be described in more detail with reference to the related drawings. Optional embodiments of the present application are shown in the drawings. However, the present application may be embodied in many different forms and should not be construed as being limited to the embodiments described herein. Rather, these embodiments are provided to facilitate more thorough and complete understanding of the disclosure of the present application.

Unless defined otherwise, all technical and scientific terms used herein have the same meaning as commonly understood by one of ordinary skill in the art to which the present application belongs. The terms used in the specification of the present application herein is for the purpose of describing particular embodiments only and is not intended to be limiting of the present application. As used herein, the term "and/or" includes any and all combinations of one or more of the associated listed items.

Figure 1:
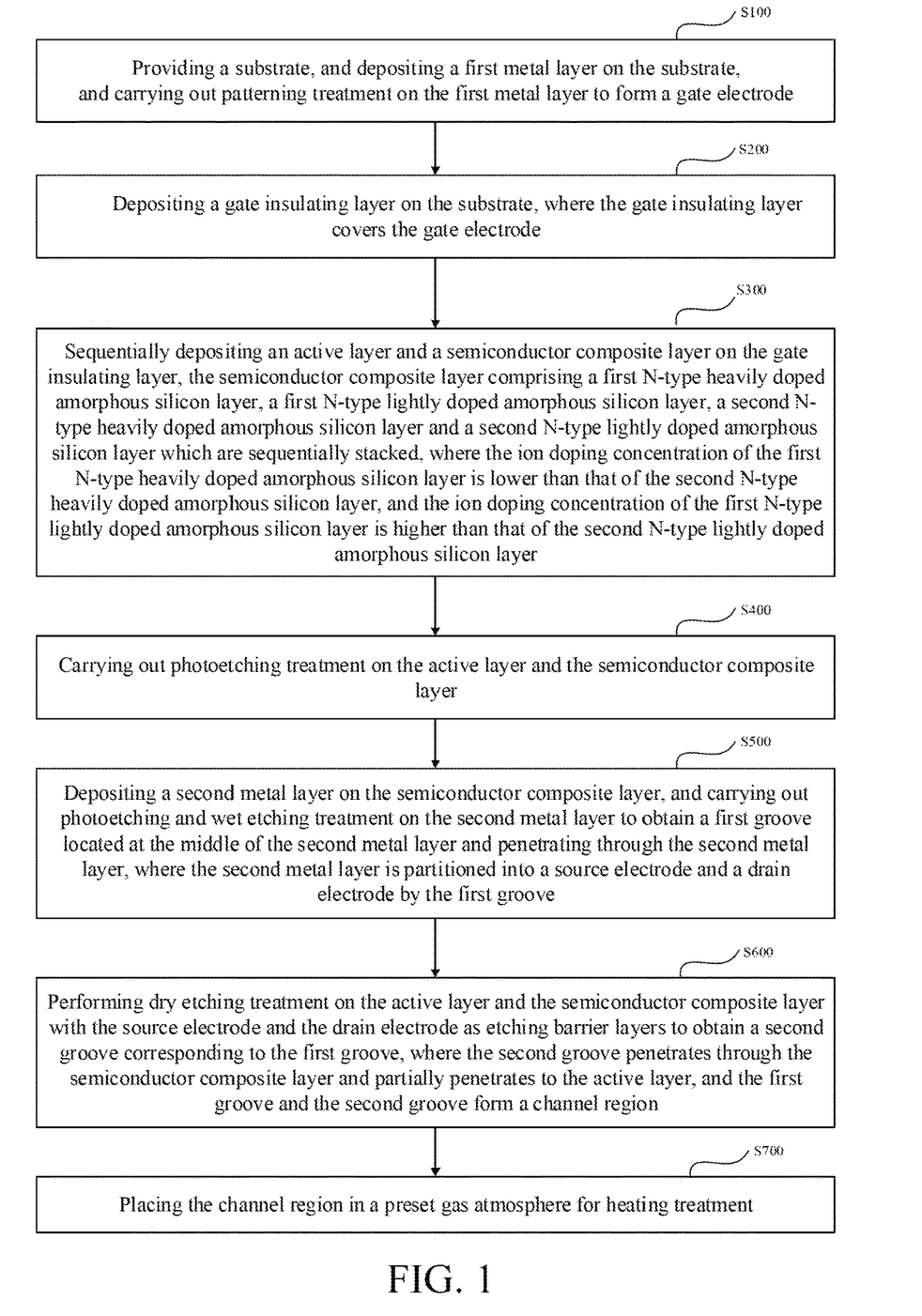
FIG. 1 is a flow schematic diagram illustrating a manufacturing method of an active switch according to an embodiment.

Referring to FIG. 1, which is a flow schematic diagram of a manufacturing method of an active switch according to an embodiment. The manufacturing method of the active switch can include the following steps: S100-S700.

Step S100 includes providing a substrate, depositing a first metal layer on the substrate, and carrying out patterning treatment on the first metal layer to form a gate electrode.

Figure 2:
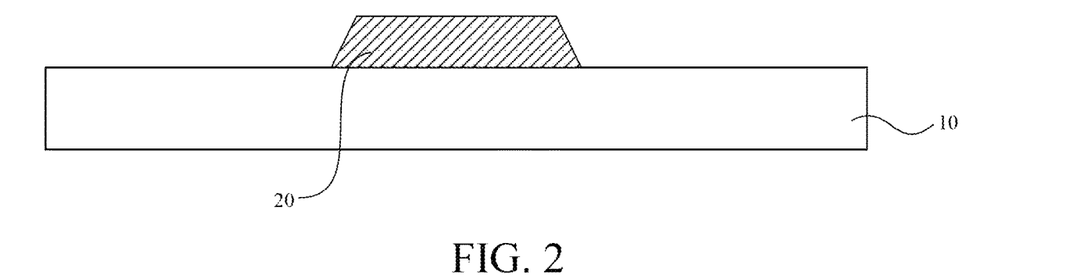
FIG. 2 is a schematic diagram of the structure formed according to step S100 in FIG. 1.

Specifically, referring to FIG. 2 for assistance, a substrate 10 may be a glass substrate or a plastic substrate, where the glass substrate may be an alkali-free borosilicate ultra-thin glass, and the alkali-free borosilicate glass has higher physical characteristics, relatively good corrosion resistance, higher thermal stability, lower density and higher elastic modulus. The deposition of the first metal layer (not labeled in FIG. 2) on the substrate 10 may be realized by a radio frequency magnetron sputtering process, a thermal evaporation process, a vacuum electron beam evaporation process and a plasma-enhanced chemical vapor deposition process. The first metal layer (not labeled in FIG. 2) may be a stacked combination of one or more of molybdenum, titanium, aluminum and copper. The patterning treatment may be to form a desired pattern, namely a gate electrode 20, by photoetching treatment. The thickness of the gate electrode 20 may range from 3000 angstroms to 5000 angstroms; optionally, the thickness of the gate electrode 20 may be 3000 angstroms to 4000 angstroms; and further, the thickness of the gate electrode 20 may be 4000 angstroms to 5000 angstroms. It can be understood that the thickness of the gate electrode 20 can be selected and adjusted according to the actual application and product performance, and is not further limited herein.

Step S200 includes depositing a gate insulating layer on the substrate, where the gate insulating layer covers the gate electrode.

Figure 3:
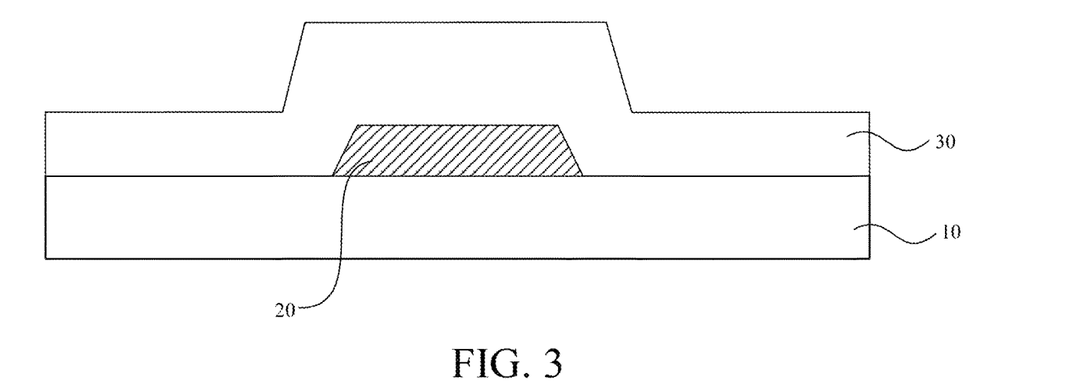
FIG. 3 is a schematic diagram of the structure formed according to step S200 in FIG. 1.
Figure 8:
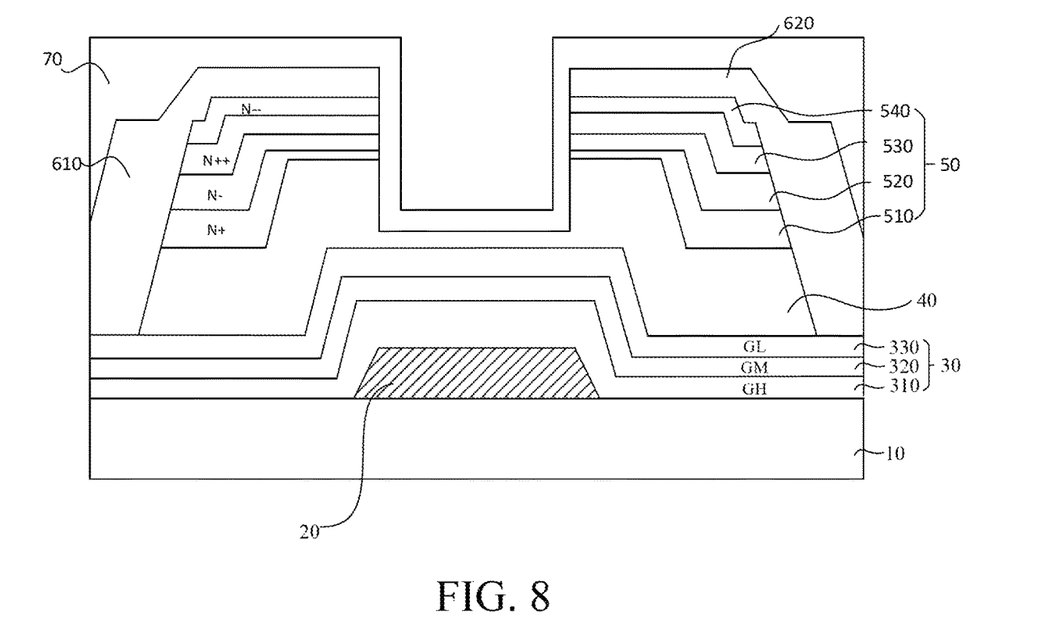
FIG. 8 is a structural schematic diagram of an active switch according to another embodiment.

Specifically, referring to FIG. 3 and FIG. 8 for assistance, a gate insulating layer 30 is deposited on the substrate 10, and the gate insulating layer 30 covers the gate electrode 20. The deposition processes may include a radio frequency magnetron sputtering process, a thermal evaporation process, a vacuum electron beam evaporation process and a plasma-enhanced chemical vapor deposition process. The thickness of the gate insulating layer 30 may be 3000 angstroms to 5000 angstroms; optionally, the thickness of the gate insulating layer 30 may be 3000 angstroms to 4000 angstroms; further, the thickness of the gate insulating layer 30 may be 4000 angstroms to 4500 angstroms; and still further, the thickness of the gate insulating layer 30 may be 4500 angstroms to 5000 angstroms. It can be understood that the thickness of the gate insulating layer 30 can be selected and adjusted according to the actual application and product performance, and is not further limited herein.

Still further, the gate insulating layer 30 may include a first sub-gate insulating layer 310, a second sub-gate insulating layer 320 and a third sub-gate insulating layer 330 which are sequentially stacked. Taking the plasma-enhanced chemical vapor deposition process as an example, the plasma-enhanced chemical vapor deposition process is adopted to form the first sub-gate insulating layer 310 by depositing at a first speed, then form the second sub-gate insulating layer 320 on the first sub-gate insulating layer 310 by depositing at a second speed, and lastly form the third sub-gate insulating layer 330 on the second sub-gate insulating layer 320 by depositing at a third speed, where values of the first speed, the second speed and the third speed are reduced sequentially, namely the value of the first speed is greater than that of the second speed, and the value of the second speed is greater than that of the third speed, which can be understood in this way: the first speed is a high speed, and accordingly the second speed is a medium speed and the third speed is a low speed. That is, in FIG. 5, GH indicates that the first speed is the high speed, GM indicates that the second speed is the medium speed, and GL indicates that the third speed is the low speed. Of course, the values are not particularly limited in the present application, and those skilled in the art can adjust and select according to actual production status and product performance.

Further, the thickness of the first sub-gate insulating layer 310 formed by depositing at the first speed may be 0 angstrom to 3000 angstroms, the thickness of the second sub-gate insulating layer 320 formed by depositing at the second speed may be 1000 angstroms to 3000 angstroms, and the thickness of the third sub-gate insulating layer 330 formed by depositing at the third speed may be 1000 angstroms to 2000 angstroms. The gate insulating layer is formed by depositing with 3 deposition stages, that is, the gate insulating layer finally formed can be controlled by controlling the thickness and the speed of the three deposition stages. Exemplarily, the first sub-gate insulating layer 310 is denoted by GH, and the second sub-gate insulating layer 320 is denoted by GM, and in one or more embodiments, the thicknesses of GH, GM and GL can be respectively selected to be 0 angstrom, 3000 angstroms and 1700 angstroms. It should be noted that, when the thickness of the GH is 0 angstrom, that is, when the thickness of the first sub-gate insulating layer 310 formed by depositing at high speed in the gate insulating layer 30 is 0 angstrom, although the thickness of the GH is 0 angstrom, in this case, compared with the thickness (4000 angstrom) of the exemplary gate insulating layer, a way of reducing the thickness of the gate insulating layer 30 formed by depositing at the first speed (high speed) and increasing the thickness of the gate insulating layer (e.g., 4300 angstroms, 4500 angstroms, 4700 angstroms) adopted by the present application may improve the resistance ability of the TFT, improve the stability of the TFT, thus achieving the purpose of improving the display effect of the display. Therefore, the light leakage current can be reduced by this way of reducing the thickness of the GH and relatively increasing the thickness of the gate insulating layer. The formation by depositing of the gate insulating layer 30 is divided into three deposition stages. Depositing first at the first speed can increase the deposition speed and improve the production capability, and then depositing at the second speed is used to realize a speed transition to the third speed, the deposition at which can enable the subsequently formed channel region to have good interface characteristics, and meanwhile reduce the concave-convex characteristic of the interfaces of the amorphous silicon and the gate insulating layer, and improve the electron mobility.

Step S300 includes sequentially depositing an active layer and a semiconductor composite layer on the gate insulating layer, the semiconductor composite layer including a first N-type heavily doped amorphous silicon layer, a first N-type lightly doped amorphous silicon layer, a second N-type heavily doped amorphous silicon layer and a second N-type lightly doped amorphous silicon layer which are sequentially stacked, where the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer.

Specifically, an active layer 40 and a semiconductor composite layer 50 may be deposited by a radio frequency magnetron sputtering process, a thermal evaporation process, a vacuum electron beam evaporation process and a plasma-enhanced chemical vapor deposition process. Further, referring to FIG. 4, the semiconductor composite layer 50 may include a first N-type heavily doped amorphous silicon layer 510, a first N-type lightly doped amorphous silicon layer 520, a second N-type heavily doped amorphous silicon layer 530 and a second N-type lightly doped amorphous silicon layer 540 which are sequentially stacked. Exemplarily, the plasma-enhanced chemical vapor deposition is taken as an example. The active layer 40 may be deposited using SiH4 gas, and the first N-type heavily doped amorphous silicon layer 510, the first N-type lightly doped amorphous silicon layer 520, the second N-type heavily doped amorphous silicon layer 530 and the second N-type lightly doped amorphous silicon layer 540 may be deposited using PH3 gas and SiH4 gas.

Step S400 includes carrying out photoetching treatment on the active layer and the semiconductor composite layer.

Figure 4:
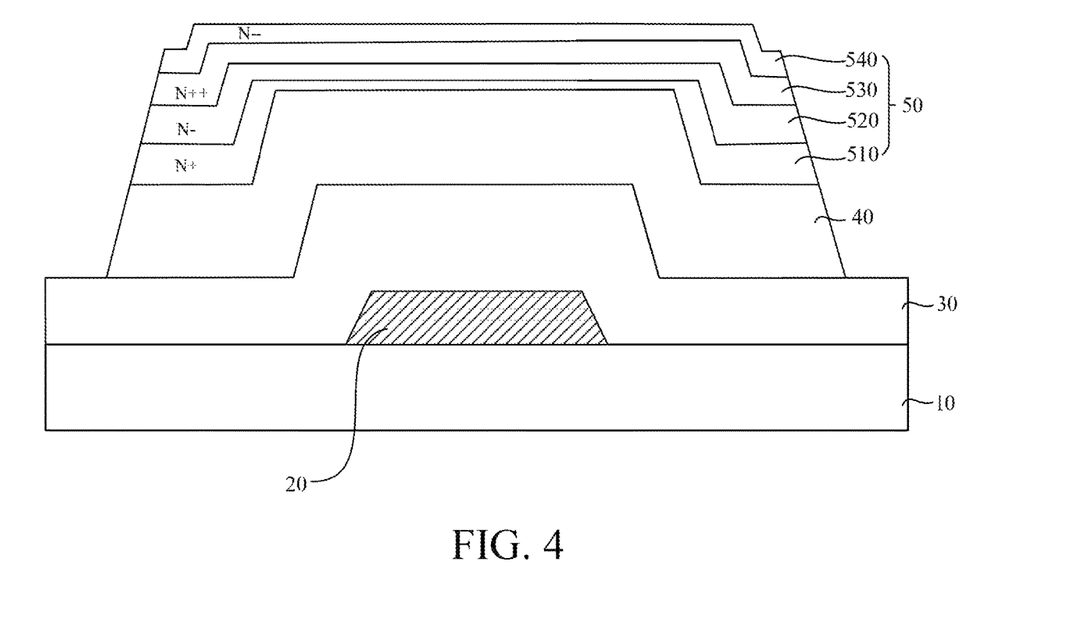
FIG. 4 is a schematic diagram of the structure formed according to steps S300 and S400 in FIG. 1.

Specifically, referring to FIG. 4 for assistance, the active layer 40 and the semiconductor composite layer 50 are subjected to photoetching treatment. The photoetching refers to subjecting a mask plate with a certain layer of design pattern to exposing and image developing to allow the photosensitive photoresist to form a three-dimensional relief pattern on a substratum.

Step S500 includes depositing a second metal layer on the semiconductor composite layer and carrying out photoetching and wet etching treatment on the second metal layer to obtain a first groove located at the middle of the second metal layer and penetrating through the second metal layer, where the second metal layer is partitioned into a source electrode and a drain electrode by the first groove.

Figure 5:
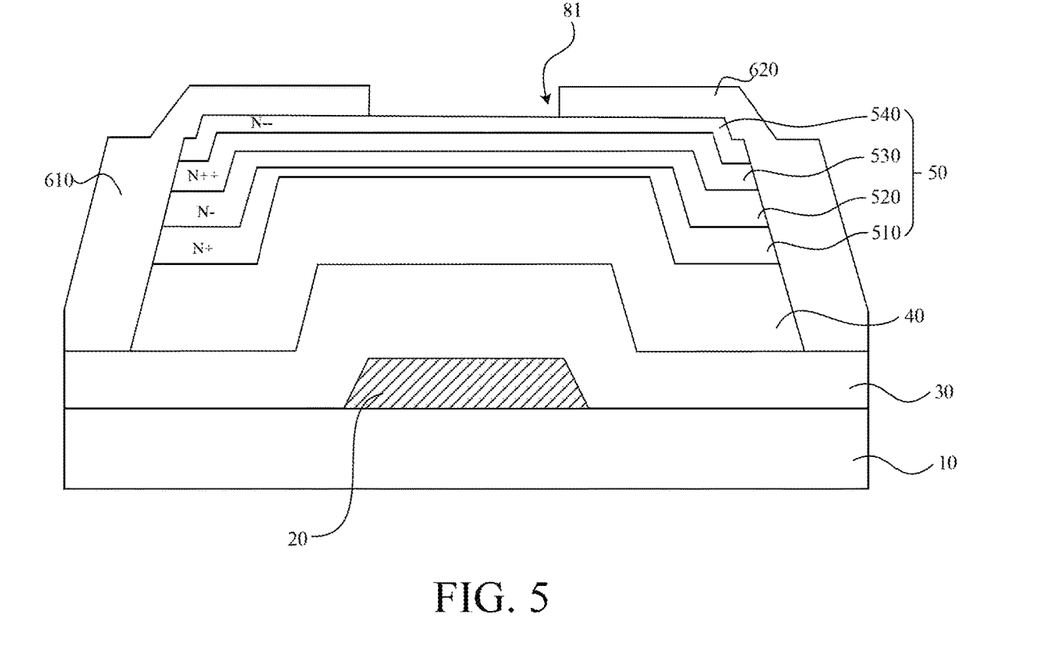
FIG. 5 is a schematic diagram of the structure formed according to step S500 in FIG. 1.

Specifically, referring to FIG. 5, a second metal layer (not labeled in FIG. 5) is deposited on the semiconductor composite layer 50, and the second metal layer is subjected to photoetching and wet etching treatment to obtain a first groove 81 located at the middle of the second metal layer and penetrating through the second metal layer, where the second metal layer is partitioned into a source electrode 610 and a drain electrode 620 by the first groove 81. Further, a photoresist layer can be coated on the second metal layer, and then the photoresist layer is subjected to exposing and image developing using a photomask. Still further, the second metal layer is then wet etched with the photoresist layer as a shield to obtain the first groove 81 located at the middle of the second metal layer and penetrating through the first metal layer, thus obtaining the three-dimensional pattern as shown in FIG. 5. On the left and right sides of the first recess 81 are the source electrode 610 and the drain electrode 620, respectively.

Step S600 includes performing dry etching treatment on the active layer and the semiconductor composite layer with the source electrode and the drain electrode as etching barrier layers to obtain a second groove corresponding to the first groove, where the second groove penetrates through the semiconductor composite layer and partially penetrates to the active layer, and the first groove and the second groove form a channel region.

Figure 6:
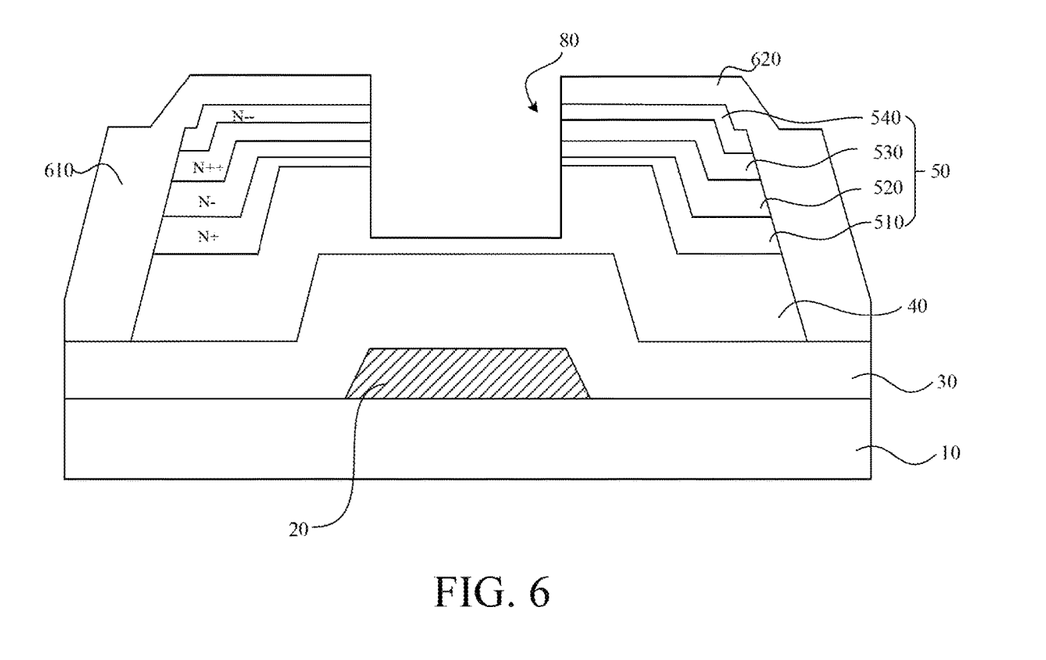
FIG. 6 is a schematic diagram of the structure formed according to step S600 in FIG. 1.

Specifically, referring to FIG. 6 for assistance, after the source electrode 610 and the drain electrode 620 are formed, the active layer 40 and the semiconductor composite layer 50 are subjected to dry etching treatment with the source electrode 610 and the drain electrode 620 as etching barrier layers, so as to obtain a second recess (not labeled in FIG. 6) corresponding to the first recess 81. The second groove penetrates through the semiconductor composite layer 50 and partially penetrates to the active layer 40. "Partially penetrating" means that the part of the active layer in the second recess is not etched away completely, and the active layer cannot be etched away completely because it acts as a conductive medium. It can be understood that the specific thickness of the "partially penetrating" can be selected and adjusted according to the actual production status and product performance. The first groove 81 and the second groove form a channel region 80.

S700 includes placing the channel region in a preset gas atmosphere for heating treatment.

Specifically, the channel region 80 will be damaged when performing etching on the active layer 40 and the semiconductor composite layer 50 to form the channel region 80, and therefore, to repair the damage of the channel region 80, a gas heating treatment may be performed on the channel region 80.

The specific heating environment and heating time may be as follows: first heating the channel region for 0 s to 50 s at a heating temperature of 275° C. to 285° C., optionally heating for 25 s; and lastly heating in ammonia gas atmosphere for 0 s to 20 s, optionally heating in an ammonia gas atmosphere for 10 s.

In the manufacturing method of the active switch described above, by arranging the semiconductor composite layer (the first N-type heavily doped amorphous silicon layer, the first N-type lightly doped amorphous silicon layer, the second N-type heavily doped amorphous silicon layer and the second N-type lightly doped amorphous silicon layer) with a plurality of concentration gradients to replace the original single-layer doped layer, energy barrier between the source and drain electrodes and the semiconductor composite layer can be increased, potential barrier of hole transmission can be improved, and the leakage current of a back channel in a switch device can be reduced; and further, by placing the channel region in a preset gas atmosphere for heating treatment, the damage of the channel region can be repaired, weak bonds in the amorphous silicon can be reduced, the illumination and illumination stability of the active switch can be enhanced and the drift of the threshold voltage is reduced, and thus the final display effect of the display device can be improved.

Figure 7:
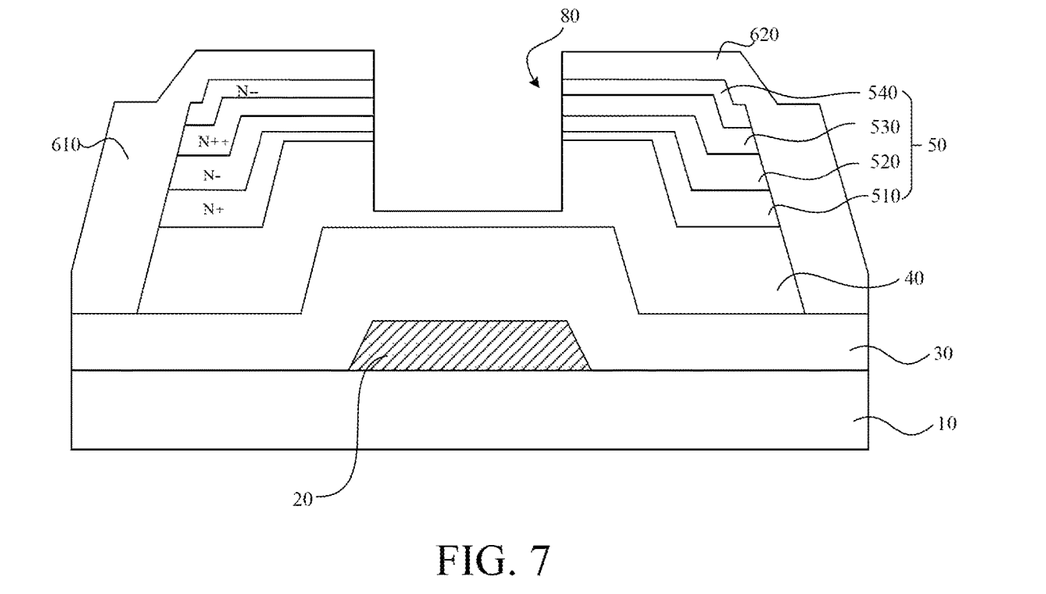
FIG. 7 is a structural schematic diagram of an active switch according to an embodiment.

Referring to FIG. 7, which is a structural schematic diagram of an active switch according to an embodiment. The active switch may include a substrate 10, a gate electrode 20, a gate insulating layer 30, an active layer 40, a semiconductor composite layer 50, and a source electrode 610 and a drain electrode 620; where the gate electrode 20 is formed on the substrate 10, the gate insulating layer 30 is formed on the substrate 10 and the gate insulating layer 30 covers the gate electrode 20, the active layer 40 is formed on the gate insulating layer 30, the semiconductor composite layer 50 is formed on the active layer 40, and the source electrode 610 and the drain electrode 620 are formed on the semiconductor composite layer 50; where the semiconductor composite layer 50 includes a first N-type heavily doped amorphous silicon layer 510, a first N-type lightly doped amorphous silicon layer 520, a second N-type heavily doped amorphous silicon layer 530 and a second N-type lightly doped amorphous silicon layer 540 which are sequentially stacked, where the ion doping concentration of the first N-type heavily doped amorphous silicon layer 510 is lower than that of the second N-type heavily doped amorphous silicon layer 530, and the ion doping concentration of the first N-type lightly doped amorphous silicon layer 520 is higher than that of the second N-type lightly doped amorphous silicon layer 540; a channel region 80 is located at the middle of the semiconductor composite layer 50 and the channel region 80 penetrates through the semiconductor composite layer 50 and partially penetrates to the active layer 40; and the source electrode 610 and the drain electrode 620 are respectively located at the two sides of the channel region 80. The active switch of the present application may be, for example, a TFT.

In the active switch described above, by arranging the semiconductor composite layer (the first N-type heavily doped amorphous silicon layer, the first N-type lightly doped amorphous silicon layer, the second N-type heavily doped amorphous silicon layer and the second N-type lightly doped amorphous silicon layer) with a plurality of concentration gradients to replace the original single-layer doped layer, energy barrier between the source and drain electrodes and the semiconductor composite layer can be increased, potential barrier of hole transmission can be improved, and the leakage current of a back channel in a switch device can be reduced.

The substrate 10 may be a glass substrate or a plastic substrate, where the glass substrate may be an alkali-free borosilicate ultra-thin glass, and the alkali-free borosilicate glass has higher physical characteristics, relatively good corrosion resistance, higher thermal stability, lower density and higher elastic modulus.

The gate electrode 20 is formed on the substrate 10, where the forming process of the gate electrode 20 may include a radio frequency magnetron sputtering process, a thermal evaporation process, a vacuum electron beam evaporation process and a plasma-enhanced chemical vapor deposition process. It can be understood that the forming process of the gate electrode 20 can be selected and adjusted according to the actual application and product performance, and is not further limited herein. A material of the gate electrode 20 may be a stacked combination of one or more of molybdenum, titanium, aluminum and copper, and selecting molybdenum, titanium, aluminum and copper as the material of the gate electrode 20 can ensure good conductivity. It can be understood that the material of the gate electrode 20 can be selected and adjusted according to the actual application and product performance, and is not further limited herein. The thickness of the gate electrode 20 may range from 3000 angstroms to 5000 angstroms; optionally, the thickness of the gate electrode 20 may be 3000 angstroms to 4000 angstroms; and further, the thickness of the gate electrode 20 may be 4000 angstroms to 5000 angstroms. It can be understood that the thickness of the gate electrode 20 can be selected and adjusted according to the actual application and product performance, and is not further limited herein.

The gate insulating layer 30 is formed on the substrate 10, and the forming process of the gate electrode 30 may include a radio frequency magnetron sputtering process, a thermal evaporation process, a vacuum electron beam evaporation process and a plasma-enhanced chemical vapor deposition process. It can be understood that the forming process of the gate insulating layer 30 can be selected and adjusted according to the actual application and product performance, and is not further limited herein. The material of the gate insulating layer 30 may be one of silicon oxide and silicon nitride, or a combination of the two, that is, the gate insulating layer 30 may be silicon oxide, silicon nitride, or a mixture of silicon oxide and silicon nitride. It can be understood that the material of the gate insulating layer 30 can be selected and adjusted according to the actual application and product performance, and is not further limited herein. The thickness of the gate insulating layer 30 may be 3000 angstroms to 5000 angstroms; optionally, the thickness of the gate insulating layer 30 may be 3000 angstroms to 3500 angstroms; further, the thickness of the gate insulating layer 30 may be 3500 angstroms to 4000 angstroms; and still further, the thickness of the gate insulating layer 30 may be 4000 angstroms to 5000 angstroms. It can be understood that the thickness of the gate insulating layer 30 can be selected and adjusted according to the actual application and product performance, and is not further limited herein.

The active layer 40 is formed on the gate insulating layer 30, and the forming process of the active layer 40 may include a radio frequency magnetron sputtering process, a thermal evaporation process, a vacuum electron beam evaporation process and a plasma-enhanced chemical vapor deposition process. It can be understood that the forming process of the active layer 40 can be selected and adjusted according to the actual application and product performance, and is not further limited herein. The material of the active layer 40 may be amorphous silicon, and the active layer 40 generally serves as a conductive medium. The thickness of the active layer 40 may be 550 angstroms to 700 angstroms; optionally, the thickness of the active layer 40 may be 550 angstroms to 600 angstroms; and still further, the thickness of the active layer 40 may be 600 angstroms to 700 angstroms. It can be understood that the thickness of the active layer 40 can be selected and adjusted according to the actual application and product performance, and is not further limited herein.

The semiconductor composite layer 50 is formed on the active layer 40, and the forming process of the semiconductor composite layer 50 may include a radio frequency magnetron sputtering process, a thermal evaporation process, a vacuum electron beam evaporation process and a plasma-enhanced chemical vapor deposition process. It can be understood that the forming process of the semiconductor composite layer 50 can be selected and adjusted according to the actual application and product performance, and is not further limited herein. The semiconductor composite layer 50 may be N-type doped, where the doping modes may include high temperature diffusion and ion implantation. The high temperature diffusion refers to diffusing or depositing impurity atoms onto the surface of a silicon wafer through a vapor source or doped oxide, and the concentration of these impurities decreases monotonically from the surface to the inside, where in the high temperature diffusion, the distribution of the impurities is primarily determined by the high temperature and the diffusion time. The ion injection refers to injecting doped ions into a semiconductor in the form of an ion beam, and the concentration of impurities exhibits a distribution of peaks in the semiconductor, where in the ion injection, the distribution of the impurities is mainly determined by ion mass and injection energy. N-type doping is mainly the doping of pentavalent impurity elements in semiconductors, such as phosphorus and arsenic. The advantages of ion injection over high temperature diffusion are as follows: (1) the injected ions are selected by a mass analyzer and the selected particles have high purity and single energy, and therefore the doping concentration is not influenced by the purity of the impurity source; in addition, the injection process is carried out under clean and dry vacuum conditions, and various pollution is reduced to the minimum level; (2) the number of doped atoms injected into the wafer can be precisely controlled, and the injection dose ranges widely from $10^{11}/cm^2$ for adjusting the threshold voltage to $10^{17}/cm^2$ for forming the insulating buried layer; and (3) during ion injection, the substratum is typically maintained at room temperature or a temperature environment of less than 400° C. Therefore, silicon dioxide, silicon nitride, aluminum, photoresist and the like can be used as masking film for selective doping, making self-aligned masking techniques more flexible in device manufacturing.

Further, the semiconductor composite layer 50 may include a first N-type heavily doped amorphous silicon layer 510, a first N-type lightly doped amorphous silicon layer 520, a second N-type heavily doped amorphous silicon layer 530 and a second N-type lightly doped amorphous silicon layer 540 which are sequentially stacked. As shown in FIG. 7, N+ represents the first N-type heavily doped amorphous silicon layer 510, N− represents the first N-type lightly doped amorphous silicon layer 520, N++ represents the second N-type heavily doped amorphous silicon layer 530, and N−− represents the second N-type lightly doped amorphous silicon layer 540. The signs in N−−, N−, N+ and N++ represent the concentrations of ion doping, where the ion doping concentration of the first N-type heavily doped amorphous silicon layer 510 is lower than that of the second N-type heavily doped amorphous silicon layer 530, and the ion doping concentration of the first N-type lightly doped amorphous silicon layer 520 is higher than that of the second N-type lightly doped amorphous silicon layer 540.

Specifically, the ion doping concentration of the first N-type lightly doped amorphous silicon layer 520 is 1.5 times to 3 times as much as that of the second N-type lightly doped amorphous silicon layer 540; optionally, the ion doping concentration of the first N-type lightly doped amorphous silicon layer 520 is 1.5 times to 2 times as much as that of the second N-type lightly doped amorphous silicon layer 540; and optionally, the ion doping concentration of the first N-type lightly doped amorphous silicon layer 520 is 2 times to 3 times as much as that of the second N-type lightly doped amorphous silicon layer 540. The ion doping concentration of the first N-type heavily doped amorphous silicon layer 510 is 2 times to 6 times as much as that of the first N-type lightly doped amorphous silicon layer 520; optionally, the ion doping concentration of the first N-type heavily doped amorphous silicon layer 510 is 2 times to 4 times as much as that of the first N-type lightly doped amorphous silicon layer 520; and optionally, the ion doping concentration of the first N-type heavily doped amorphous silicon layer 510 is 4 times to 6 times as much as that of the first N-type lightly doped amorphous silicon layer 520. The ion doping concentration of the second N-type heavily doped amorphous silicon layer 530 is 1.5 times to 3 times as much as that of the first N-type heavily doped amorphous silicon layer 510; optionally, the ion doping concentration of the second N-type heavily doped amorphous silicon layer 530 is 1.5 times to 2 times as much as that of the first N-type heavily doped amorphous silicon layer 510; and optionally, the ion doping concentration of the second N-type heavily doped amorphous silicon layer 530 is 2 times to 3 times as much as that of the first N-type heavily doped amorphous silicon layer 510.

Still further, the thickness of the semiconductor composite layer 50 may be 300 angstroms to 600 angstroms. Optionally, the thickness of the semiconductor composite layer 50 may be 300 angstroms to 400 angstroms; optionally, the thickness of the semiconductor composite layer 50 may be 400 angstroms to 500 angstroms; and optionally, the thickness of the semiconductor composite layer 50 may be 500 angstroms to 600 angstroms. It can be understood that the thickness of the semiconductor composite layer 50 can be selected and adjusted according to the actual application and product performance, and is not further limited herein. The semiconductor composite layer 50 includes a first N-type heavily doped amorphous silicon layer 510, a first N-type lightly doped amorphous silicon layer 520, a second N-type heavily doped amorphous silicon layer 530 and a second N-type lightly doped amorphous silicon layer 540 which are sequentially stacked. Therefore, the thickness of the first N-type heavily doped amorphous silicon layer 510 may be 80 angstroms to 200 angstroms; optionally, the thickness of the first N-type heavily doped amorphous silicon layer 510 may be 80 angstroms to 100 angstroms; and optionally, the thickness of the first N-type heavily doped amorphous silicon layer 510 may be 100 angstroms to 200 angstroms. The thickness of the first N-type lightly doped amorphous silicon layer 520 may be 80 angstroms to 200 angstroms; optionally, the thickness of the first N-type lightly doped amorphous silicon layer 520 may be 80 angstroms to 100 angstroms; and optionally, the thickness of the first N-type lightly doped amorphous silicon layer 520 may be 100 angstroms to 200 angstroms. The thickness of the second N-type heavily doped amorphous silicon layer 530 may be 80 angstroms to 200 angstroms; optionally, the thickness of the second N-type heavily doped amorphous silicon layer 530 may be 80 angstroms to 100 angstroms; and optionally, the thickness of the second N-type heavily doped amorphous silicon layer 530 may be 100 angstroms to 200 angstroms. The thickness of the second N-type lightly doped amorphous silicon layer 540 may be 80 angstroms to 200 angstroms; optionally, the thickness of the second N-type lightly doped amorphous silicon layer 540 may be 80 angstroms to 100 angstroms; and optionally, the thickness of the second N-type lightly doped amorphous silicon layer 540 may be 100 angstroms to 200 angstroms. Exemplarily, the thickness of 400 angstroms of the semiconductor composite layer is taken as an example, where the thickness of the first N-type heavily doped amorphous silicon layer 510 may be 100 angstroms, the thickness of the first N-type lightly doped amorphous silicon layer 520 may be 100 angstroms, the thickness of the second N-type heavily doped amorphous silicon layer 530 may be 100 angstroms, and the thickness of the second N-type lightly doped amorphous silicon layer 540 may be 100 angstroms. It can be understood that the thicknesses of the first N-type heavily doped amorphous silicon layer 510, the first N-type lightly doped amorphous silicon layer 520, the second N-type heavily doped amorphous silicon layer 530 and the second N-type lightly doped amorphous silicon layer 540 may be selected and adjusted according to actual production status and product performance, and is not further limited herein. Equally dividing the thickness of the semiconductor composite layer 50 into four sub-doping layers with different ion doping concentrations and the same thickness can ensure that the overall size of the original device is not influenced and also make the electron injection easier due to different concentration gradients among the sub-doping layers. Furthermore, energy barrier between the source and drain electrodes and the semiconductor composite layer can be effectively increased, and meanwhile potential barrier of hole transmission can be improved, the leakage current is reduced, and the reliability and the stability of the TFTs are improved.

The source electrode 610 and the drain electrode 620 are formed on the semiconductor composite layer 50, and the forming process of the source electrode 610 and the drain electrode 620 may include a radio frequency magnetron sputtering process, a thermal evaporation process, a vacuum electron beam evaporation process and a plasma-enhanced chemical vapor deposition process. It can be understood that the forming process of the source electrode 610 and the drain electrode 620 can be selected and adjusted according to the actual application and product performance, and is not further limited herein. The material of the source electrode 610 and the drain electrode 620 may be a stacked combination of one or more of molybdenum, titanium, aluminum and copper, and selecting molybdenum, titanium, aluminum and copper as the material of the source electrode 610 and the drain electrode 620 can ensure good conductivity. It can be understood that the material of the source electrode 610 and the drain electrode 620 can be selected and adjusted according to the actual application and product performance, and is not further limited herein. The thickness of the source electrode 610 and the drain electrode 620 may be 3500 angstroms to 5000 angstroms; optionally, the thickness of the source electrode 610 and the drain electrode 620 may be 3500 angstroms to 4000 angstroms; and further, the thickness of the source electrode 610 and the drain electrode 620 may be 4000 angstroms to 5000 angstroms. It can be understood that the material and the thickness of the source electrode 610 and the drain electrode 620 may be the same or different, and the material and the thickness of the source electrode 610 and the drain electrode 620 may be selected and adjusted according to the actual application and product performance, and are not further limited herein.

The channel region 80 is located at the middle of the semiconductor composite layer 50, and the channel region 80 penetrates through the semiconductor composite layer 50 and partially penetrates through the active layer 40. The source electrode 610 and drain electrode 620 are respectively located on the two sides of the channel region 80. The "penetrating through" can be realized by photoetching or etching. Specifically, the photoetching refers to subjecting a mask plate with a certain layer of design pattern to exposing and image developing to allow the photosensitive photoresist to form a three-dimensional relief pattern on a substratum. The etching refers to performing, under the masking of the photoresist, selective etching on film layers by adopting different etching substances and methods according to different micro-patterns that these film layers need to form. Thus, after the photoresist is removed, the three-dimensional design pattern is transferred to the associated film layer of the substratum.

Referring to FIG. 8, which is a structural schematic diagram of an active switch according to another embodiment. The active switch may include a substrate 10, a gate electrode 20, a gate insulating layer 30, an active layer 40, a semiconductor composite layer 50, and a source electrode 610 and a drain electrode 620; where the gate electrode 20 is formed on the substrate 10, the gate insulating layer 30 is formed on the substrate 10 and the gate insulating layer 30 covers the gate electrode 20, the active layer 40 is formed on the gate insulating layer 30, the semiconductor composite layer 50 is formed on the active layer 40, and the source electrode 610 and the drain electrode 620 are formed on the semiconductor composite layer 50; where the semiconductor composite layer 50 includes a first N-type heavily doped amorphous silicon layer 510, a first N-type lightly doped amorphous silicon layer 520, a second N-type heavily doped amorphous silicon layer 530 and a second N-type lightly doped amorphous silicon layer 540 which are sequentially stacked, where the ion doping concentration of the first N-type heavily doped amorphous silicon layer 510 is lower than that of the second N-type heavily doped amorphous silicon layer 530, and the ion doping concentration of the first N-type lightly doped amorphous silicon layer 520 is higher than that of the second N-type lightly doped amorphous silicon layer 540; a channel region 80 is located at the middle of the semiconductor composite layer 50 and the channel region 80 penetrates through the semiconductor composite layer 50 and partially penetrates to the active layer 40; and the source electrode 610 and the drain electrode 620 are respectively located at the two sides of the channel region 80. The active switch of the present application may be, for example, a TFT.

It can be understood that for the material, the forming process, the composition, the thickness and the like of the substrate 10, the gate electrode 20, the active layer 40, the semiconductor composite layer 50, the source electrode 610 and the drain electrode 620, reference may be made to the description of the embodiments of the foregoing active switch, and further description thereof is omitted here.

Referring to FIG. 8, the gate insulating layer 30 may include a first sub-gate insulating layer 310, a second sub-gate insulating layer 320 and a third sub-gate insulating layer 330 which are sequentially stacked. Taking the plasma-enhanced chemical vapor deposition process as an example, the plasma-enhanced chemical vapor deposition process is adopted to form the first sub-gate insulating layer 310 by depositing at a first speed, then form the second sub-gate insulating layer 320 on the first sub-gate insulating layer 310 by depositing at a second speed, and lastly form the third sub-gate insulating layer 330 on the second sub-gate insulating layer 320 by depositing at a third speed, where values of the first speed, the second speed and the third speed are reduced sequentially, namely the value of the first speed is greater than that of the second speed, and the value of the second speed is greater than that of the third speed, which can be understood in this way: the first speed is a high speed, and accordingly the second speed is a medium speed and the third speed is a low speed. That is, in FIG. 8, GH indicates that the first speed is the high speed, GM indicates that the second speed is the medium speed, and GL indicates that the third speed is the low speed. Of course, the values are not particularly limited in the present application, and those skilled in the art can adjust and select according to actual production status and product performance.

Further, the thickness of the first sub-gate insulating layer 310 formed by depositing at the first speed may be 0 angstrom to 3000 angstroms, the thickness of the second sub-gate insulating layer 320 formed by depositing at the second speed may be 1000 angstroms to 3000 angstroms, and the thickness of the third sub-gate insulating layer 330 formed by depositing at the third speed may be 1000 angstroms to 2000 angstroms.

A protective layer 70 is mainly used to protect the TFT device from contamination and damage, and specifically, the protective layer 70 is also called a Passivation (PV) layer, and the material of the protective layer 70 may be silicon nitride, silicon oxide or a combination thereof. It can be understood that the thickness of the protective layer 70 is not particularly limited, and those skilled in the art can adjust and select according to actual production status and product performance.

In the active switch described above, by arranging the semiconductor composite layer (the first N-type heavily doped amorphous silicon layer, the first N-type lightly doped amorphous silicon layer, the second N-type heavily doped amorphous silicon layer and the second N-type lightly doped amorphous silicon layer) with a plurality of concentration gradients to replace the original single-layer doped layer, energy barrier between the source and drain electrodes and the semiconductor composite layer can be increased, potential barrier of hole transmission can be improved, and the leakage current of a back channel in a switch device can be reduced; by depositing a first sub-gate insulating layer at a first speed, depositing a second sub-gate insulating layer on the first sub-gate insulating layer at a second speed, and depositing a third sub-gate insulating layer on the second sub-gate insulating layer at a third speed, meanwhile values of the first speed, the second speed and the third speed being sequentially reduced, that is, by changing the thickness and the property of the gate insulating layer through changing the deposition speed and the deposition thickness of each sub-gate insulating layer in the gate insulating layer, the leakage current of a back channel in a switch device can be reduced; and still further, by placing the channel region in a preset gas atmosphere for heating treatment, the damage of the channel region can be repaired, weak bonds in the amorphous silicon can be reduced, the illumination and illumination stability of the active switch can be enhanced and the drift of the threshold voltage is reduced, and thus the final display effect of the display device can be improved. Further, by providing the protective layer 70, the TFT can be protected from damage.

A display device can include the foregoing active switch, in the display device described above, by arranging the semiconductor composite layer (the first N-type heavily doped amorphous silicon layer, the first N-type lightly doped amorphous silicon layer, the second N-type heavily doped amorphous silicon layer and the second N-type lightly doped amorphous silicon layer) with a plurality of concentration gradients to replace the original single-layer doped layer, energy barrier between the source and drain electrodes and the semiconductor composite layer can be increased, potential barrier of hole transmission can be improved, and the leakage current of a back channel in a switch device can be reduced; and further, by placing the channel region in a preset gas atmosphere for heating treatment, the damage of the channel region can be repaired, weak bonds in the amorphous silicon can be reduced, the illumination and illumination stability of the active switch can be enhanced and the drift of the threshold voltage is reduced, and thus the final display effect of the display device can be improved.

The technical features of the embodiments described above can be combined arbitrarily. For the sake of brevity, all possible combinations of the technical features of the above embodiments are not described, and such combinations of the technical features shall be deemed to fall within the scope of the present disclosure as long as there is no contradiction.

The embodiments described above only describe several implementations of the present application, and the description thereof is specific and detailed. However, those cannot be therefore construed as limiting the scope of the present application. It should be noted that, for those of ordinary skill in the art, several variations and modifications can be made without departing from the concept of the present disclosure, which also fall within the scope of the present disclosure. Therefore, the protection scope of the present application shall be defined by the appended claims.

What is claimed is:

1. A manufacturing method of an active switch, comprising:
    providing a substrate, depositing a first metal layer on the substrate, and carrying out patterning treatment on the first metal layer to form a gate electrode;
    depositing a gate insulating layer on the substrate, wherein the gate insulating layer covers the gate electrode; wherein the gate insulating layer comprises a first sub-gate insulating layer, a second sub-gate insulating layer and a third sub-gate insulating layer which are sequentially stacked, the first sub-gate insulating layer is deposited at a first speed, the second sub-gate insulating layer is deposited at a second speed, the third sub-gate insulating layer is deposited at a third speed, and values of the first speed, the second speed and the third speed are sequentially reduced;
    sequentially depositing an active layer and a semiconductor composite layer on the gate insulating layer, the semiconductor composite layer comprising a first N-type heavily doped amorphous silicon layer, a first N-type lightly doped amorphous silicon layer, a second N-type heavily doped amorphous silicon layer and a second N-type lightly doped amorphous silicon layer which are sequentially stacked, wherein the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer;
    carrying out photoetching treatment on the active layer and the semiconductor composite layer;
    depositing a second metal layer on the semiconductor composite layer, and carrying out photoetching and wet etching treatment on the second metal layer to obtain a first groove located at the middle of the second metal layer and penetrating through the second metal layer, wherein the second metal layer is partitioned into a source electrode and a drain electrode by the first groove;
    performing dry etching treatment on the active layer and the semiconductor composite layer with the source electrode and the drain electrode as etching barrier layers to obtain a second groove corresponding to the first groove, wherein the second groove penetrates through the semiconductor composite layer and partially penetrates to the active layer, and the first groove and the second groove form a channel region, wherein the source electrode and the drain electrode cover the second N-type lightly doped amorphous silicon layer; and
    placing the channel region in a preset gas atmosphere for heating treatment.

2. The manufacturing method of the active switch according to claim 1, wherein the step of placing the channel region in a preset gas atmosphere for heating treatment comprises:
    first heating the channel region for 0 s to 50 s, and lastly heating in an ammonia gas atmosphere for 0 s to 20 s.

3. The manufacturing method of the active switch according to claim 2, wherein the step of placing the channel region in a preset gas atmosphere for heating treatment comprises:
    first heating the channel region far 25 s, and lastly heating in an ammonia gas atmosphere for 10 s.

4. The manufacturing method of the active switch according to claim 1, wherein a deposition process of the first metal layer comprises one of a radio frequency magnetron sputtering process, a thermal evaporation process, a vacuum electron beam evaporation process and a plasma-enhanced chemical vapor deposition process.

5. The manufacturing method of the active switch according to claim 1, wherein the thickness of the gate insulating layer formed by depositing at the first speed is 0 angstrom to 3000 angstroms, the thickness of the gate insulating layer formed by depositing at the second speed is 1000 angstroms to 3000 angstroms, and the gate insulating layer formed by depositing at the third speed is 1000 angstroms to 2000 angstroms.

6. The manufacturing method of the active switch according to claim 1, wherein the first N-type heavily doped amorphous silicon layer, the first N-type lightly doped amorphous silicon layer, the second N-type heavily doped amorphous silicon layer and the second N-type lightly doped amorphous silicon layer are deposited using PH3 gas and SiH4 gas.

7. An active switch, wherein the active switch is manufactured using a manufacturing method of an active switch, the manufacturing method of an active switch comprising:
provding a substrate, depositing a first metal layer on the substrate, and carrying out patterning treatment on the first metal layer to form a gate electrode;
depositing a gate insulating layer on the substrate, wherein the gate insulating layer covers the gate electrode;
sequentially depositing an active layer and a semiconductor composite layer on the gate insulating layer, the semiconductor composite layer comprising a first N-type heavily doped amorphous silicon layer, a first N-type lightly doped amorphous silicon layer, a second N-type heavily doped amorphous silicon layer and a second N-type lightly doped amorphous silicon layer which are sequentially stacked, wherein the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer;
carrying out photoetching treatment on the active layer and the semiconductor composite layer;
depositing a second metal layer on the semiconductor composite layer, and carrying out photoetching and wet etching treatment on the second metal layer to obtain a first groove located at the middle of the second metal layer and penetrating through the second metal layer, wherein the second metal layer is partitioned into a source electrode and a drain electrode by the first groove;
performing dry etching treatment on the active layer and the semiconductor composite layer with the source electrode and the drain electrode as etching barrier layers to obtain a second groove corresponding to the first groove, wherein the second groove penetrates through the semiconductor composite layer and partially penetrates to the active layer, and the first groove and the second groove form a channel region wherein the source electrode and the drain electrode cover the second N-type lightly doped amorphous silicon layer; and
placing the channel region in a preset gas atmosphere for heating treatment;
the active switch comprising:
a substrate;
a gate electrode formed on the substrate;
a gate insulating layer formed on the substrate, wherein the gate insulating layer covers the gate electrode;
an active layer formed on the gate insulating layer;
a semiconductor composite layer formed on the active layer; and
a source electrode and a drain electrode formed on the semiconductor composite layer;
wherein the gate insulating layer comprises a first sub-gate insulating layer, a second sub-gate insulating layer and a third sub-gate insulating layer which are sequentially stacked, the first sub-gate insulating layer is deposited at a first speed, the second sub-gate insulating layer is deposited at a second speed, the third sub-gate insulating layer is deposited at a third speed, and values of the first speed, the second speed and the third speed are sequentially reduced; wherein the semiconductor composite layer comprises a first N-type heavily doped amorphous silicon layer, a first N-type lightly doped amorphous silicon layer, a second N-type heavily doped amorphous silicon layer and a second N-type lightly doped amorphous silicon layer which are sequentially stacked, wherein the ion doping concentration of the first N-type heavily doped amorphous silicon layer is lower than that of the second N-type heavily doped amorphous silicon layer, and the ion doping concentration f the first N-type lightly doped amorphous silicon layer is higher than that of the second N-type lightly doped amorphous silicon layer; a channel region is located at the middle of the semiconductor composite layer and the channel region penetrates through the semiconductor composite layer and partially penetrates to the active layer; and the source electrode and the drain electrode are respectively located at the two sides of the channel region.

8. The active switch according to claim 7, wherein the thickness of the semiconductor composite layer is 300 angstroms to 600 angstroms, wherein the thickness of the first N-type lightly doped amorphous silicon layer is 80 angstroms to 200 angstroms, the thickness of the second N-type lightly doped amorphous silicon layer is 80 angstroms to 200 angstroms, the thickness of the first N-type heavily doped amorphous silicon layer is 80 angstroms to 200 angstroms, and the thickness of the second N-type heavily doped amorphous silicon layer is 80 angstroms to 200 angstroms.

9. The active switch according to claim 8, wherein the thickness of the semiconductor composite layer is 400 angstroms, wherein the thickness of the first N-type lightly doped amorphous silicon layer is 100 angstroms, the thickness of the second N-type lightly doped amorphous silicon layer is 100 angstroms, the thickness of the first N-type heavily doped amorphous silicon layer is 100 angstroms, and the thickness of the second N-type heavily doped amorphous silicon layer is 100 angstroms.

10. The active switch according to claim 7, wherein the ion doping concentration of the first N-type lightly doped amorphous silicon layer is 1.5 times to 3 times as much as that of the second N-type lightly doped amorphous silicon layer, the ion doping concentration of the first N-type heavily doped amorphous silicon layer is 2 times to 6 times as much as that of the first N-type lightly doped amorphous silicon layer, and the ion doping concentration of the second N-type heavily doped amorphous silicon layer is 1.5 times to 3 times as much as that of the first N-type heavily doped amorphous silicon layer.

11. The active switch according to claim 10, wherein the ion doping concentration of the first N-type lightly doped amorphous silicon layer is 2 times to 3 times as much as that of the second N-type lightly doped amorphous silicon layer, the ion doping concentration of the first N-type heavily doped amorphous silicon layer is 4 times to 6 times as much as that of the first N-type lightly doped amorphous silicon layer, and the ion doping concentration of the second N-type heavily doped amorphous silicon layer is 2 times to 3 times as much as that of the first N-type heavily doped amorphous silicon layer.

12. The active switch according to claim 7, wherein the thickness of the gate insulating layer ranges from 3500 angstroms to 5000 angstroms.

13. The active switch according to claim 12, wherein the gate insulating layer comprises at least one of silicon oxide and silicon nitride.

14. The active switch according to claim 7, wherein the thickness of the gate electrode ranges from 3000 angstroms to 5000 angstroms.

15. The active switch according to claim 14, wherein the gate electrode comprises at least one of molybdenum, titanium, aluminum and copper.

16. The active switch according to claim 7, wherein the thickness of the source electrode ranges from 3500 angstroms to 5000 angstroms, and the thickness of the drain electrode ranges from 3500 angstroms to 5000 angstroms.

17. The active switch according to claim 16, wherein the source electrode comprises at least one of molybdenum, titanium, aluminum and copper, and the drain electrode comprises at least one of molybdenum, titanium, aluminum and copper.

18. The active switch according to claim 7, wherein the active switch comprises:
a protective layer formed on the source electrode and the drain electrode.

19. A display device comprising an active switch, the active switch comprising:
a substrate;
a gate electrode formed on the substrate;
a gate insulating layer formed on the substrate, wherein the gate insulating layer covers the gate electrode;
an active layer formed on the gate insulating layer;
a semiconductor composite layer formed on the active layer; and
a source electrode and a drain electrode formed on the semiconductor composite layer;
wherein the gate insulating layer comprises a first sub-gate insulating layer, a second sub-gate insulating layer and a third sub-gate insulating layer which are sequentially stacked, the first sub-gate insulating layer is deposited at a first speed, the second sub-gate insulating layer is deposited at a second speed, the third sub-gate insulating layer is deposited at a third speed, and values of the first speed, the second speed and the third speed are sequentially reduced; wherein the semiconductor composite layer comprises a first N-type heavily doped amorphous silicon layer, a first N-type lightly doped amorphous silicon layer, a second N-type heavily doped amorphous silicon layer and a second N-type lightly doped amorphous silicon layer which are sequentially stacked, wherein the ion doping concentration of the first N-type heavily doped amorphous silicon layer is lower than that of the second N-type heavily doped amorphous silicon layer, and the ion doping concentration of the first N-type lightly doped amorphous silicon layer is higher than that of the second N-type lightly doped amorphous silicon layer; a channel region is located at the middle of the semiconductor composite layer and the channel region penetrates through the semiconductor composite layer and partially penetrates to the active layer; and the source electrode and the drain electrode are respectively located at the two sides of the channel region, wherein the source electrode and the electrode cover the second N-type lightly doped amorphous silicon layer.

* * * * *